United States Patent [19]
Glenn et al.

[11] Patent Number: 4,866,578
[45] Date of Patent: Sep. 12, 1989

[54] INSPECTION FIXTURE FOR THE SOLDER SIDE OF PRINTED CIRCUIT BOARDS

[75] Inventors: Thomas R. Glenn, Aurora; Norman S. Zaremba, St. Charles, both of Ill.

[73] Assignee: AG Communication Systems Corporation, Phoenix, Ariz.

[21] Appl. No.: 278,896

[22] Filed: Dec. 2, 1988

[51] Int. Cl.⁴ ............................................. F21V 33/00
[52] U.S. Cl. .................................. 362/139; 362/282; 362/253; 269/903
[58] Field of Search ................... 362/33, 97, 138, 139, 362/282, 310, 253; 269/903; 29/741, 760, 739

[56] References Cited

U.S. PATENT DOCUMENTS 2,629,924  3/1953  Kauper ........................... 362/138 X
4,120,563 10/1978  Stefanou ......................... 362/138 X
4,149,311  4/1979  Benson et al. .................... 269/903 X Primary Examiner—Stephen F. Husar
Attorney, Agent, or Firm—Robert J. Black; Gregory G. Hendricks

[57] ABSTRACT

A printed circuit board inspection fixture adapted to support a printed circuit board and including a light source and a mirrored reflective surface positioned to reflect light from the source onto the bottom side of said printed circuit board in order to facilitate inspection of the lower portion so as to detect improper lead insertion of components positioned on the circuit board.

10 Claims, 2 Drawing Sheets

INSPECTION FIXTURE FOR THE SOLDER SIDE OF PRINTED CIRCUIT BOARDS

BACKGROUND OF THE INVENTION

1. Field of the Invention

The present invention relates to the inspection of printed circuit boards and more particularly to a fixture facilitating the inspection of the underside of a printed circuit board after components have been inserted in the board but prior to their soldering in place.

2. Description of the Prior Art

In the manual assembly of printed circuit boards, unclinched electronic components are not fastened to the printed circuit board prior to wave soldering. In this mode of manufacture, only top side inspection of component placement for appropriate accuracy could be performed. The inspection of the bottom side of the printed circuit board would require turning the printed circuit board over which would then allow the components to fall out of the board due to the force of gravity. Obviously, the disadvantages of performing only top side inspection relates to the fact that if a component is mounted it may appear properly seated on the printed circuit board and it may then be assumed, and not always correctly, that all the component leads are protruding properly through the board on the solder side.

As noted, this assumption is not always correct. A condition sometimes exists where a component lead or leads may be bent under the component. Thus, while the component appears to be properly mounted when viewed from the top side, it may be incorrectly seated and thus when soldered will not function properly. This problem is an industrywide problem defined as "unseated components". The defect is especially harmful in that it may not be electrically detectable since contact between the bent lead or leads may be made on the top side of the printed circuit board although mechanical fastening via solder has not been achieved. Subsequent movement of the device, printed circuit board or the lead may cause an electrical failure of the final product prior to shipment or "in the field".

Prior solutions to this problem required a top side retainer to be installed to hold the components in place when the board is turned over for inspection of lead presence. The use of this technique obviously requires extra tooling, handling and frequently causes damage to fragile components. Yet another solution to the problem requires the spraying of an adhesive to the printed circuit board. This technique substantially increases material costs, as well as posing a risk to the electrical characteristics of the printed circuit and obviously is applicable only to very light components. In addition to the physical risks associated with these techniques, the techniques themselves produced marginal results since bottom side up inspection will not provide the necessary geographical and topographical contrast necessary to detect lead presence or absence.

SUMMARY OF THE INVENTION

The present invention consists of an angularly adjustable mirrored surface mounted beneath a printed circuit board holding fixture. With the assembled board placed on the fixture, the bottom of the printed circuit board can be viewed by looking into the mirrored surface positioned under the printed circuit board. By utilizing a hinged arrangement for the mirrored surface and a variably positioned diffused light source, the bottom surface of the printed circuit board can be clearly viewed. An internal elevation mechanism allows the angle of the mirror to be changed to facilitate the best angle for visual inspection.

The inspectability of the minute leads protruding through the holes in the bottom of the printed circuit board can be greatly improved by adjusting the angle of the mirrored surface to the printed circuit board surface. This variability in adjustment allows for a high quality profile view of the component leads as they protrude through the board. The ability to vary the angle of view is an important feature due to the variation of component lead length, shape and location. This feature, coupled with the variable positioned diffused light source, provides the necessary visual elements required to provide for a reliable inspection of lead presence on the bottom side of an unsoldered printed circuit board assembly. Additionally, the mirrored surface can retain whatever angle is set by the operator. This feature frees the operator's hands to wiggle or agitate the top side of a component in question while simultaneously viewing the action of the component lead via the mirror to verify the proper lead position is indeed in place in those areas that present a possible question.

DESCRIPTION OF THE PREFERRED EMBODIMENT

Figure 1:
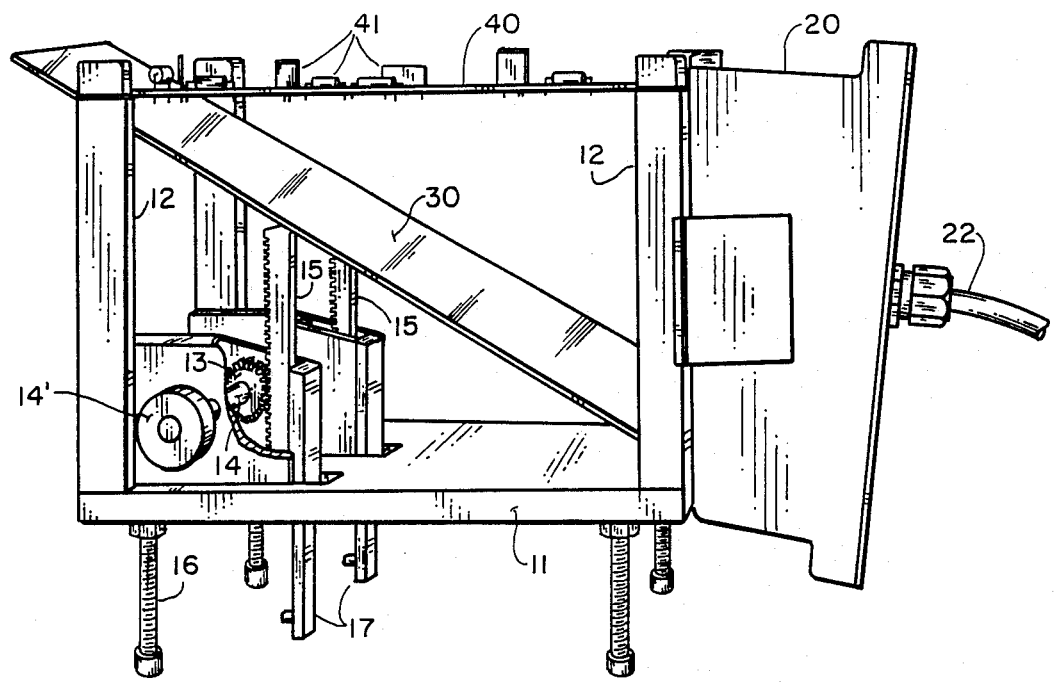
FIG. 1 is a side perspective view of an inspection fixture for printed circuit board inspection in accordance with the present invention.
Figure 2:
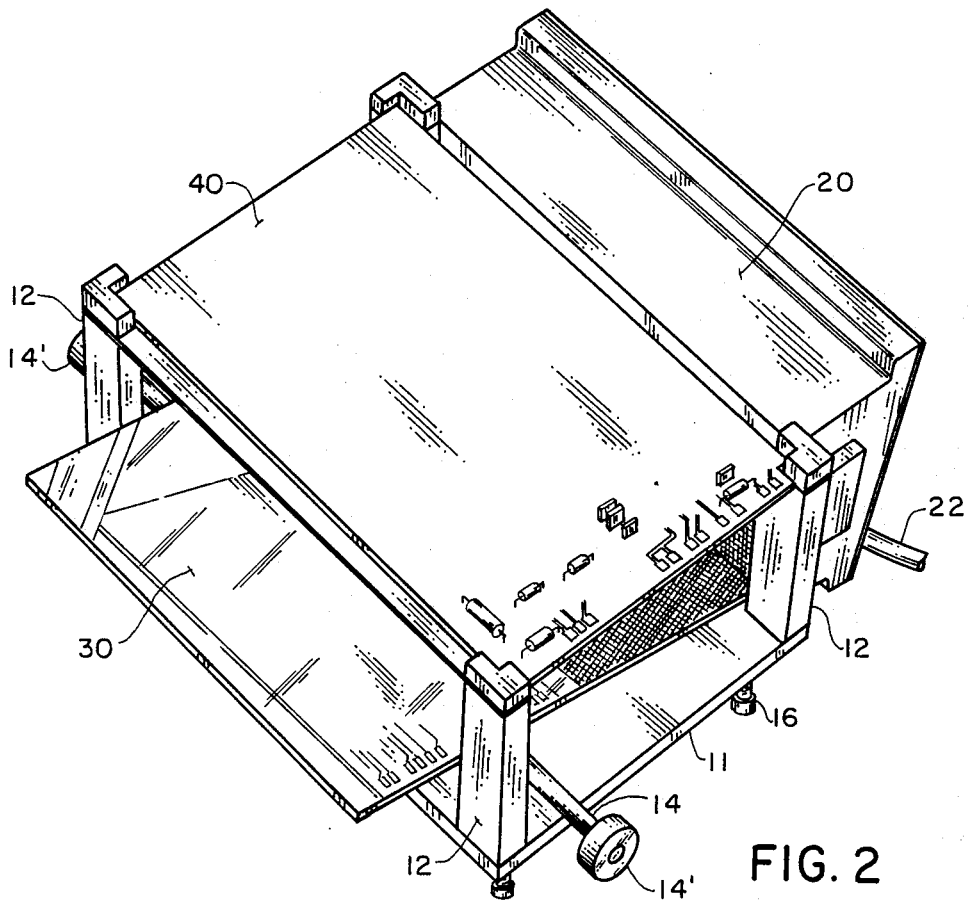
FIG. 2 is a top perspective view of a fixture for inspecting printed circuit boards in accordance with the present invention.

Referring now to FIGS. 1 and 2 of the drawings in the present invention, the present invention consists of an angularly adjustable mirror 30 mounted within a printed circuit board holding fixture, consisting of printed circuit board supports 12 and base 11, so arranged that a circuit board 40 positioned on the supports 12 can have its lower side inspected by virtue of light from light source 20 being reflected onto mirrored source 30 and then up to the bottom side of printed circuit board 40. Thus, the bottom side of a printed circuit board can be viewed so that inspection of the proper placement of component leads on components, such as 41, can be viewed to determine their proper location.

By utilizing a hinged arrangement for the mirrored surface and a variably positionable diffused light source, the bottom of the printed circuit board 40 can thus be clearly viewed. An internal elevation mechanism consisting of pinion gear 13 mounted on shaft 14 and a second pinion gear not shown, also mounted on shaft 14, engage a pair of rack type units, both labeled 15, which engage the lower side of mirror 30. By operating knob 14', shaft 14 is rotated causing the pinion gears, such as 13, to engage racks 15 and elevate or lower mirror 30. This elevation mechanism allows the angle of the mirror to be changed to facilitate the best angle for visual inspection. The light source 20 connected to electrical power source via connector 22 which is coupled to an electrical source not shown.

Also included in the basic assembly are adjustable support means including a plurality of legs, such as 16, and a pair of guides 17 fastened to base 11 which provide protection, alignment and stops for racks 15.

Figure 3:
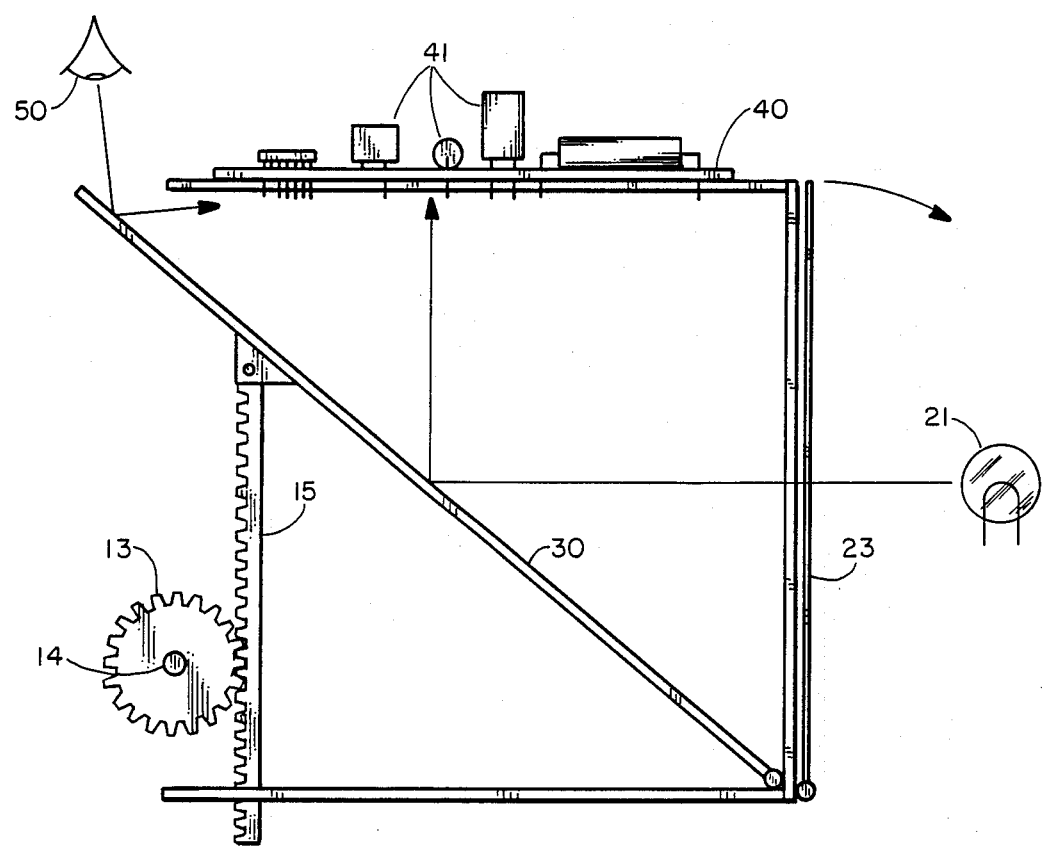
FIG. 3 is an operational side view of the major components of an inspection fixture for printed circuit boards in accordance with the present invention.

A more easily understood basis for the operation of the present invention may be seen to reference to FIG. 3 in which is shown the manner in which the operator can view readily the underside of circuit board 40 for proper component insertion. Because of light from light source 21 passing through translucent panel 23 (which is also adjustable to ensure maximum angle and the least reflection) then onto mirror 30 and reflected onto the bottom portion of circuit board 40. As can be readily seen, operation or rotation of shaft 14 will cause pinion gear 13 to revolve and raise or lower rack 15 which is fastened to the lower portion of mirror 30.

Figure 4:
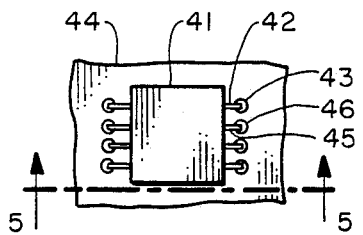
FIG. 4 is a top view of an electronic component shown in position on a printed circuit board.
Figure 5:
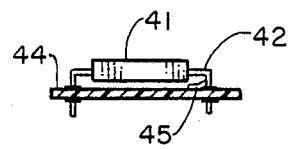
FIG. 5 is an end view of an electronic component mounted on a printed circuit board showing a lead bent under and not properly seated.
Figure 6:
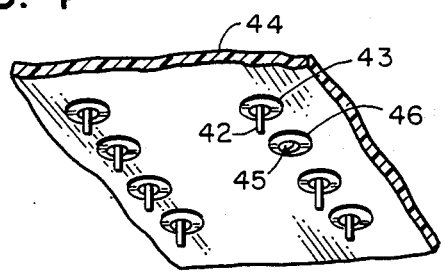
FIG. 6 is a perspective view of a printed circuit board bottom side showing both properly and improperly seated component leads.

The entire purpose of the inspection fixture of the present invention can be better understood by reference to FIGS. 4, 5 and 6 wherein component 41 is shown mounted on printed circuit board (shown in part) 44. Each of the leads from the component 41, such as 42, pass through an opening in the printed circuit board, such as 43.

Referring now to FIG. 5, which is a sectional view taken along lines 5—5 of FIG. 4, the same component 41 is shown with a lead such as 42 extending through an opening in printed circuit board 44. However, also shown is a component lead 45 which has not been properly inserted through the opening and has become bent under and in place against the upper side of circuit board 44, resulting in improper connection.

As may be readily seen in FIG. 6, it shows the underside of circuit board 44 (a portion thereof). Component lead 42, which is properly seated, extends through opening 43 and can be readily seen. On the other hand, circuit lead 45, which has been bent under, does not project through opening 46 as could be expected if it were properly seated.

While but a single embodiment of the present invention has been shown, it will be obvious to those skilled in the art that numerous modifications might be made without departing from the spirit of the present invention which shall be limited by the scope of the claims appended hereto.

What is claimed is:

1. A printed circuit board inspection fixture comprising:
    a housing, including a base;
    means for supporting a printed circuit board above said base with a bottom side of said supported printed circuit board parallel to and facing said base;
    a light source attached to said housing;
    a reflective means angularly positioned within said housing adapted to reflect light from said source onto said printed circuit board bottom side.

2. A printed circuit board inspection fixture as claimed in claim 1 wherein:
    said light source is angularly adjustable.

3. A printed circuit board inspection fixture as claimed in claim 1 wherein:
    said reflected means is angularly adjustable.

4. A printed circuit board inspection fixture as claimed in claim 3 wherein:
    said angular adjustment means comprise means for elevating, or in the alternative, lowering a first end of said reflected means.

5. A printed circuit board inspection fixture as claimed in claim 4 wherein:
    means for elevating comprise at least one manually operable rack and pinion arrangement.

6. A printed circuit board inspection fixture as claimed in claim 4 wherein:
    second end of said reflected surface is positioned adjacent to said base.

7. A printed circuit board inspection fixture as claimed in claim 1 wherein:
    said reflected means include a mirrored surface.

8. A printed circuit board inspection fixture as claimed in claim 1 wherein:
    said light source comprises an electric lamp and a translucent panel positioned essentially perpendicular to said base.

9. A printed circuit board inspection fixture as claimed in claim 8 wherein:
    said translucent panel is angularly adjustable.

10. A printed circuit board inspection fixture as claimed in claim 1 wherein:
    said means for supporting a printed circuit board are adjustable to support printed circuit boards of varying sizes.

* * * * *